US000001873H

United States Statutory Invention Registration [19]

[11] Reg. Number: H1,873

Tober et al.

[45] Published: Oct. 3, 2000

[54] SINGLE-CHIP, MULTI-FUNCTIONAL OPTOELECTRONIC DEVICE AND METHOD FOR FABRICATING SAME

[75] Inventors: Richard L. Tober, Elkridge; John D. Bruno, Bowie, both of Md.

[73] Assignee: The United States of America as represented by the Secretary of the Army, Washington, D.C.

[21] Appl. No.: 08/565,597

[22] Filed: Dec. 1, 1995

[51] Int. Cl.[7] ..... H01L 31/0232

[52] U.S. Cl. ..... 257/432

[58] Field of Search ..... 250/214 A, 214 DC; 257/290, 432, 444, 458; 372/50

[56] References Cited

U.S. PATENT DOCUMENTS

| | | | |
|---|---|---|---|
| 4,790,635 | 12/1988 | Apsley | 359/260 |
| 5,192,968 | 3/1993 | Kishida et al. | 354/410 |
| 5,404,373 | 4/1995 | Cheng | 372/50 |
| 5,550,856 | 8/1996 | Cheng | 372/50 |
| 5,572,540 | 11/1996 | Cheng | 372/50 |
| 5,666,376 | 9/1997 | Cheng | 372/50 |
| 5,689,122 | 11/1997 | Chandrasekhar | 257/184 |
| 5,742,045 | 4/1998 | Parker et al. | 250/214 A |

*Primary Examiner*—Daniel T. Pihulic

*Attorney, Agent, or Firm*—Paul S. Clohan, Jr.; Frank J. Dynda

[57] ABSTRACT

An optoelectronic device comprises a detector, an emitter and a modulator incorporated into a single semiconductor chip. The optoelectronic device provides electrical isolation and optical interconnection (via waveguides) of the components of the semiconductor chip. Contacts for providing forward and reverse bias voltages are included in the device. The optoelectronic device is fabricated by growing a strained-layer quantum diode structure to produce a piezoelectric field in a quantum well, electrically isolating portions of the structure, and optically interconnecting portions of the structure. The fabrication is carried out by using an implant process or an etching process, and without having to use either regrowth techniques or packaging together of multiple optical elements.

14 Claims, 4 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

SINGLE-CHIP, MULTI-FUNCTIONAL OPTOELECTRONIC DEVICE AND METHOD FOR FABRICATING SAME

BACKGROUND OF THE INVENTION

1. Field of the Invention

The present invention generally relates to a single-chip, multi-functional optoelectronic device and method for fabricating same, and more particularly to the growth and fabrication of an optoelectronic device in which multiple elements are physically integrated on a single semiconductor chip. More specifically, using suitable materials, growth substrates, growth sequences and fabrication techniques, an optical emitter, detector and modulator are integrated onto a single semiconductor chip. The device method of the present invention can be utilized in any number of technical applications—for example, of a repeater site in a fiber optical work system.

2. Description of the Prior Art

The state of current technology is such that emitters, detectors and modulators must each be made from different materials and material structures in order to operate at the same energy. Thus, optoelectronic devices that require more than one of these functions (i.e., emission, detection or modulation) can only be fabricated in essentially two ways. Either separate components are combined into a single package, or regrowth techniques are used to produce the separate functions on a single element (that is, a single chip).

Currently, there are no economical methods or techniques that can be utilized to produce a single-chip device that performs all three functions of emissions, detection and modulation. Current technology resorts to either regrowth techniques, impurity-induced disorder techniques, or techniques that combine multiple elements into a single package. Large, bulky interconnections are required in order to combine separate elements into a single package. Not only are the optical interconnections bulky and heavy, but they also significantly reduce the amount of power transmitted between the individual elements. Both the regrowth technique and the impurity-induced disorder technique are time-consuming and money-intensive due to the multiple processing steps that are required.

Recent studies of strained-layer quantum well structures have shown unusual behavior in that the energy which the material absorbs first increases with increasing reverse biases, and then decreases with still further increases in the reverse bias. In the latter regard, see the following: Richard L. Tober and Thomas B. Bahder, "Determining the Electric Field in [111] Strained-Layer Quantum Wells", *Appl. Phys. Lett.* 63 (17), (1993); Richard L. Tober, Thomas B. Bahder and John D. Bruno, "Characterizing Electric Fields in [111] B InGaAs Quantum Wells Using Electric Field Modulated Photoluminescence and Reflectance Techniques", accepted for *Journ. Electron. Mater.* (1995); Thomas B. Bahder, Richard L. Tober and John D. Bruno, "Temperature Dependent Polarization in [111] InGaAs-AlGaAs Quantum Wells", *Phys. Rev* B15, 50,(7), (1994); and Thomas B. Bahder, Richard L. Tober and John D. Bruno, "Pyroelectric Effect in Semiconductor Heterostructures, Superlattices and Microstructures", 14(2), (1994).

SUMMARY OF THE INVENTION

The present invention generally relates to a single-chip multi-functional optoelectronic device and method for fabricating same, and more particularly relates to the growth and fabrication of optoelectronic devices wherein multiple elements having disparate functions are physically integrated on a single semiconductor chip. The device and method of the present invention can be utilized in any number of technical applications—for example, as a repeater site in a fiber optical cable system.

In accordance with the invention, suitable materials, growth substrates, growth sequences and fabrication techniques are utilized to integrate optical emitters, detectors and modulators onto a single semiconductor chip. Thus, the present invention incorporates multiple optical functions on a single semiconductor element or chip without having to employ either regrowth techniques or multiple optical elements packaged together. In addition, in accordance with the present invention, the single-chip multi-functional optoelectronic device is realized through the use of piezoelectric semiconductors, device geometries and/or structures, and epitaxial growth techniques.

More particularly, a strained-layer quantum well diode structure is grown in such a way as to produce a piezoelectric field in the quantum well, the field pointing in a direction opposite to the diode built-in electric field. Portions of the semiconductor wafer are electrically isolated from each other, but are optically connected (preferably, via waveguides) using standard implant or etching techniques.

Therefore, it is a primary object of the present invention to provide a single-chip, multi-functional optoelectronic device.

It is an additional object of the present invention to provide for the growth and fabrication of an opto-electronic device in which multiple elements having disparate functions are physically integrated onto a single semiconductor chip.

It is an additional object of the present invention to provide a single-chip, multi-functional optoelectronic device and method for fabricating same, in which optical emitters, detectors and modulators are integrated onto a single semiconductor chip.

It is an additional object of the present invention to provide an optoelectronic device that incorporates multiple optical functions on a single semiconductor chip without employing regrowth techniques or multiple optical elements packaged together.

The above and other objects, and the nature of the invention, will be more clearly understood by reference to the following detailed description, the accompanying drawings and the appended claims.

DETAILED DESCRIPTION OF PREFERRED EMBODIMENT

The invention will now be described in more detail with reference to the various figures of the drawings.

Figure 1:
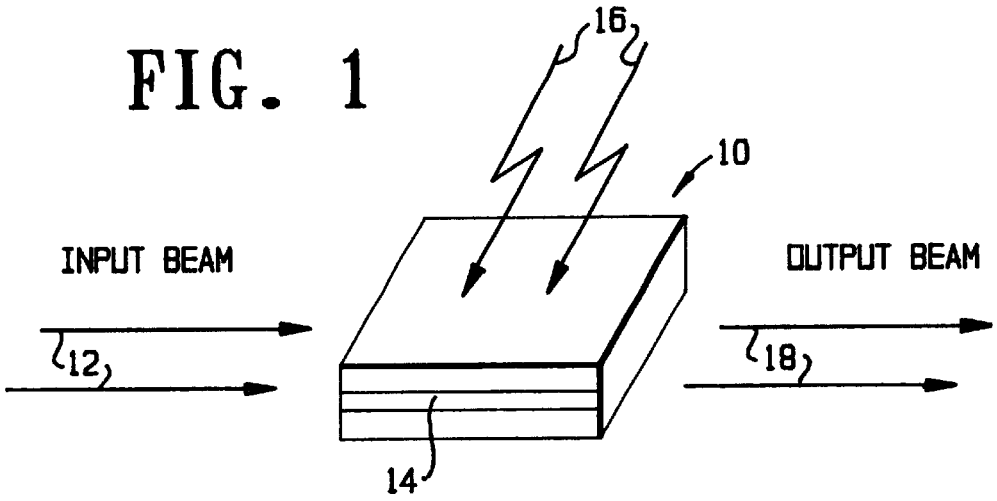
FIG. 1 is a perspective view of a single-chip multi-functional optoelectronic device in accordance with the present invention.

FIG. 1 is a perspective view of a single-chip multi-functional optoelectronic device in accordance with the present invention. As seen therein, an opto-electronic device 10 has an active region 14 and receives an input beam 12, as well as incident electromagnetic (EM) radiation 16. As a result of a modulation process which takes place within the device 10, signal information contained in the incident EM radiation 16 is modulated or encoded onto the input beam 12, thereby producing an output beam 18.

Figure 2:
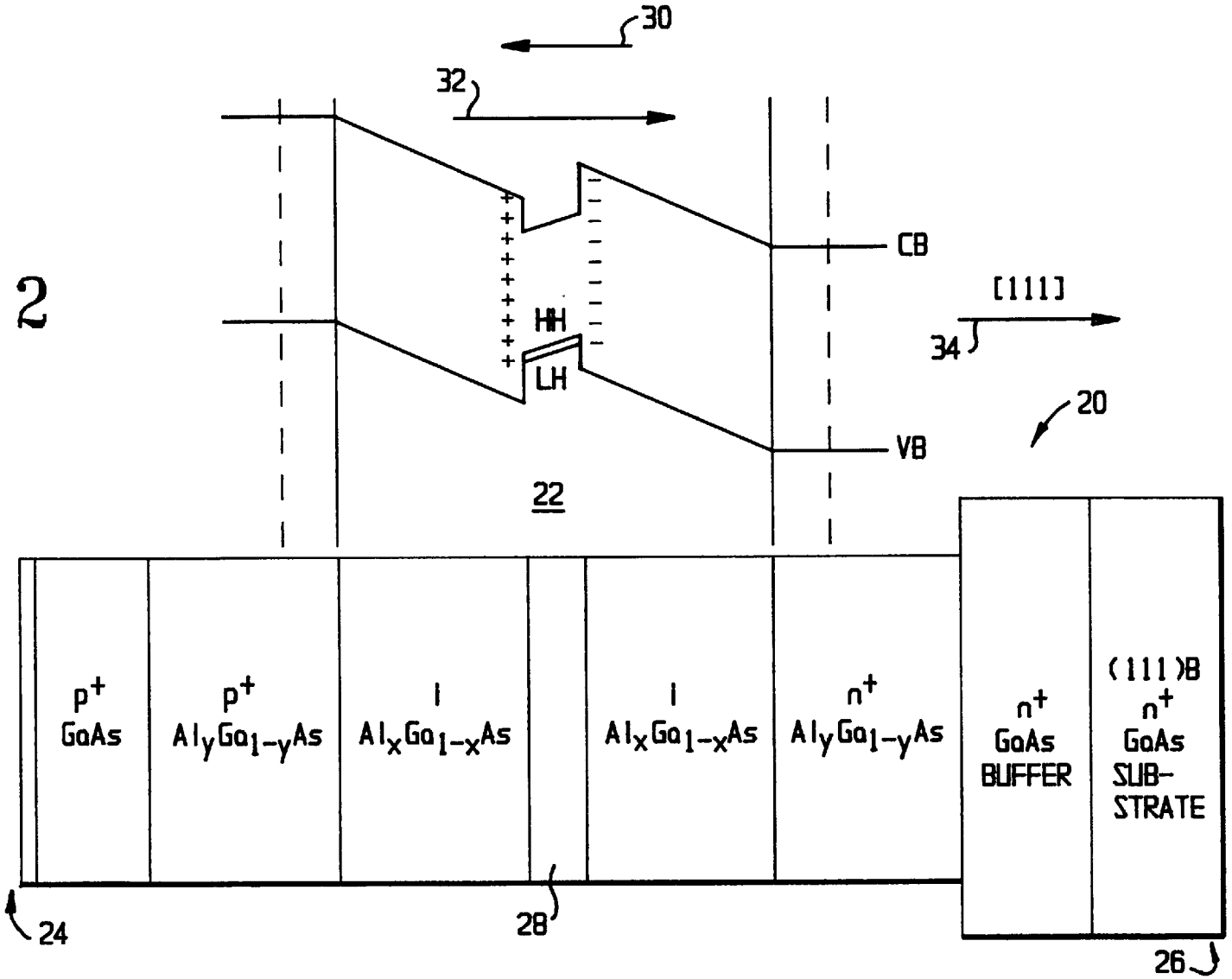
FIG. 2 is a diagrammatic representation of an optoelectronic device in accordance with the present invention, including a depiction of the energy bands of the structure in the vicinity of an active region thereof.

FIG. 2 is a diagrammatic representation of an optoelectronic device in accordance with the present invention, including a depiction of the energy bands of the structure in the vicinity of an active region thereof. In accordance with the present invention, epitaxial growth of the device 10 (FIG. 1) is performed on a GaAs (111) B substrate. The lower portion of FIG. 2 shows an isolated element 20, while the upper portion of FIG. 2 shows the energy bands of the structure in the vicinity of an active region 22. As seen in FIG. 2, isolated element 20 has electrical contacts 24 and 26 which are employed for the application of bias voltages thereto, as well as an intrinsic quantum well 28 formed from $In_zGa_{1-z}As$.

In accordance with the present invention, a strained-layer quantum well diode structure is epitaxially grown on a GaAs(111)B substrate. Since the strained-layer quantum well structure is grown on a (111) substrate, the quantum well 28 has an E-field, inside the quantum well 28, oriented in a direction opposite to the direction of the E-field within the P-I-N diode intrinsic region 22. That is to say, the E-field inside the quantum well 28 has a direction as indicated by arrow 32 (FIG. 2), while the direction of the E-field within the intrinsic region 22, but outside the quantum well 28, is indicated by the arrow 30. This phenomenon takes place for a biaxially compressed layer (for example, an InGaAs quantum well) grown in intrinsic region 22 of a P-I-N semiconductor.

The upper portion of FIG. 2 shows the energy bands of the isolated element 20 in the vicinity of the active region or intrinsic region 22, the slopes of the bands being proportional to the electric field. Thus, the conduction band (CB) and valence band (VB) have a slope, in the area corresponding to the quantum well 28, which is positive in nature, corresponding to the E-field 32 which points in the (111) direction, as indicated by arrow 34. Conversely, the CB and VB have a slope, in an area corresponding to the quantum well 28, which is negative in nature, corresponding to the direction of the E-field 30, which is opposite to the (111) direction indicated by arrow 34. In the latter regard, "HH" indicates "heavy-hole" and "LH" indicates "light-hole."

As a result of the growth of the strained-layer quantum well diode structure shown in FIG. 2, radiation is emitted from the PIN structure (that is, from levels associated with the quantum well 28) in the direction of a forward bias. The P-I-N structure can also absorb energy by reverse biasing, as will be explained below with reference to FIG. 4.

Figure 3:
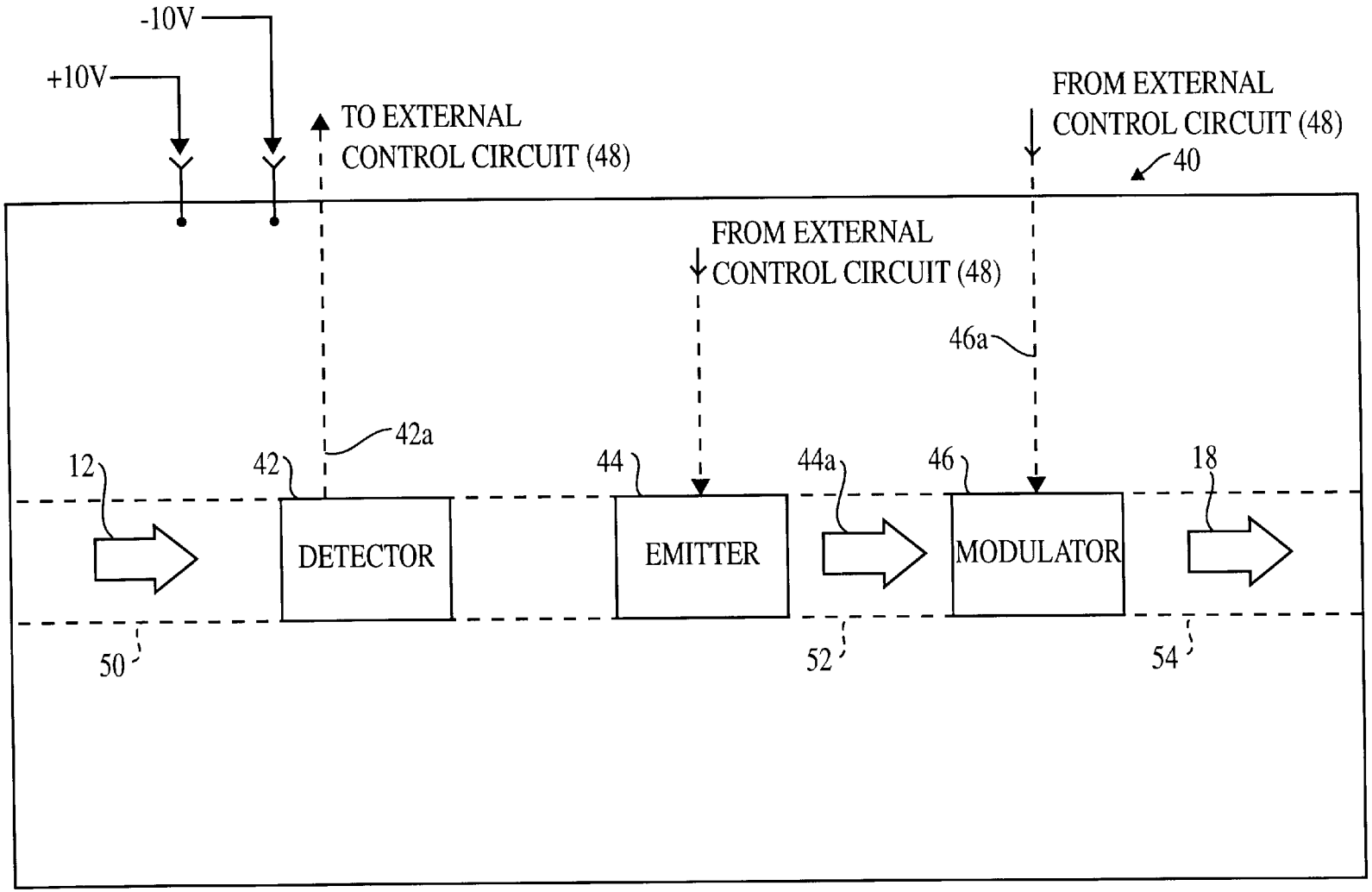
FIG. 3 is a diagrammatic representation of one possible implementation of a typical growth structure of an emitter, a detector and a modulator integrated into a single semiconductor chip.

FIG. 3 is a diagrammatic representation of one possible implementation of a typical growth structure of an emitter, a detector and a modulator integrated into a single semiconductor chip. As seen in FIG. 3, semiconductor wafer portion 40 includes electrically isolated elements—specifically, detector 42, emitter 44 and modulator 46. Waveguides 50, 52 and 54 are defined by conventional etching or implant techniques.

In operation, detector 42 receives input beam 12, which is optically transmitted via waveguide 50 to detector 42. Output signals 42*a* and 46*a* generated by detector 42 are used to control emitter 44 and modulator 46, respectively. An optical output 44*a* generated by emitter 44 is transmitted, via waveguide 52, to modulator 46, and modulator 46 produces output beam 18 which is transmitted via waveguide 54.

More specifically, the present invention could be employed at a repeater site in a fiber optical cable system. In that case, the light beam 12 (shown in FIG. 3) would have come from a fiber optic cable coupled into waveguide 50, and would be detected by a detector 42 located at a repeater site along the length of the fiber optical cable (for example, every five miles). The detector 42 would, in such an implementation, control the emitter 44 and modulator 46, as indicated by the dotted control lines 43*a* and 46*a* extending between the detector 42 and the emitter 44 and modulator 46, respectively, in FIG. 3. The precise manner in which the detector 42 would control emitter 44 and modulator 46 would be dependent upon the particular implementation or application of the present invention, and would be obvious to a person with skill in the art in that particular field of interest (for example, fiber optical cable technology).

In accordance with the invention, emitter 44 produces optical output 44*a* which, as previously discussed, is provided via waveguide 52 to modulator 46. Modulator 46 modulates its information signal (corresponding to the control input 46*a* from detector 42) onto the optical input 44*a*, thereby producing a modulated output beam 18, which is transmitted via waveguide 54. Depending upon the particular implementation involved, or the requirements of that particular implementation, the modulator output beam 18 could be provided to another repeater site located along the length of the fiber optical cable, or could actually be provided to a utilization device (not shown), such as a television or telephone, thereby producing a visual image or audible sound, respectively.

Figure 4:
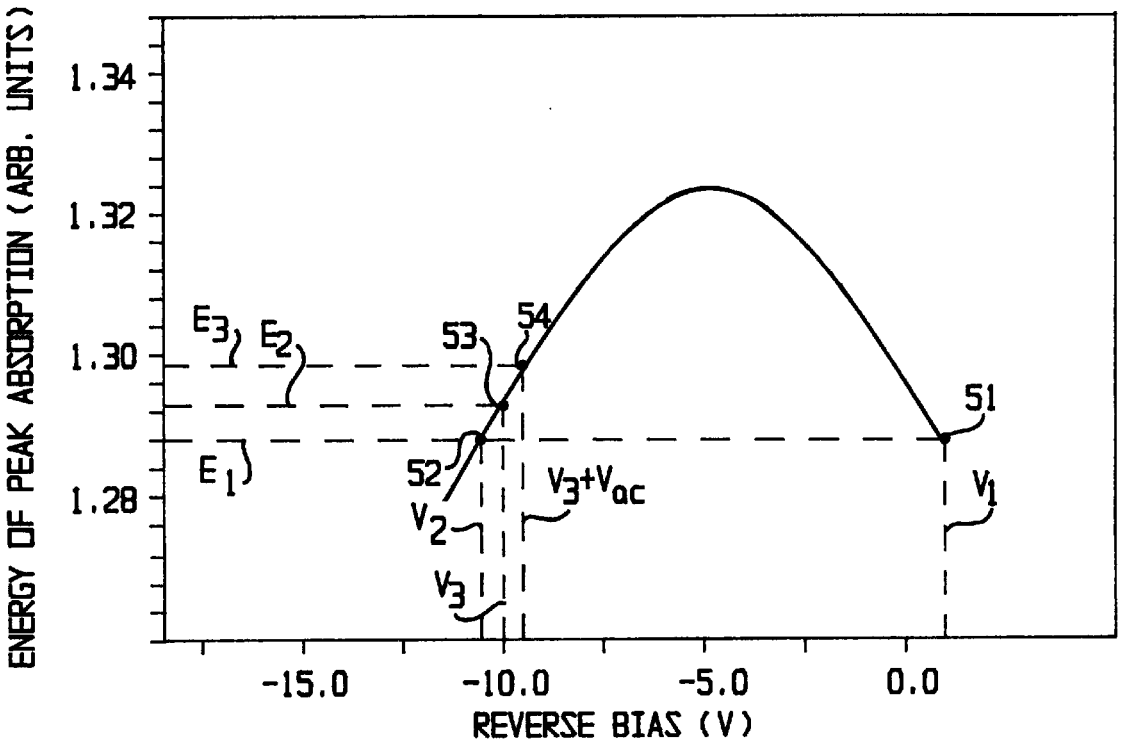
FIG. 4 is a plot of the optical transition energy of the lowest energy state in the active region of the device of the present invention as a function of applied bias voltage.

FIG. 4 is a plot of the optical transition energy of the lowest energy state in the active region of the device of the present invention as a function of applied bias voltage. As a indicated in FIG. 4, a forward bias voltage of value $V_1$ applied to an electrically isolated region of the present invention causes it to emit radiation at an energy level $E_1$ (see point 51 of FIG. 4). The consequent radiation leaving that portion of the semiconductor wafer or travelling to another electrically isolated region of the semiconductor wafer can be a result of either a stimulated emission process or a spontaneous emission process, depending on the specifics of the device requirements or design.

Further referring to FIG. 4, a reverse bias voltage of value $V_2$ applied to a different electrically isolated region of the semiconductor wafer causes it to absorb at the same energy level $E_1$ (see point 52 of FIG. 4). A reverse bias voltage of $V_3$ applied to yet another electrically isolated region of the semiconductor wafer causes it to absorb at quiescent energy level $E_2$ (see point 53 of FIG. 4). Finally, the addition of a small alternating current voltage $V_{ac}$ to the reverse bias voltage $V_3$ causes it to absorb at energies up to a level $E_3$ (see point 54 of FIG. 4). As indicated in FIG. 4, $E_1$ is less than $E_2$ and $E_2$ is equal to or less than $_3E$. In other words, the energy of peak absorption varies between $E_1$ and $E_3$ at the modulating frequency.

To summarize, referring to FIG. 4, points 51, 52, 53 and 54 indicate operating biases $V_1$, $V_2$, $V_3$ and $V_3+V_{ac}$, respectively. In particular, point 51 shows the required forward bias to achieve emission at an energy level $E_1$, point 52 shows the required reverse bias to achieve absorption at an energy level $E_1$, and point 53 shows the reverse bias required to achieve quiescent energy of a level $E_2$.

Fabrication and operation of a preferred embodiment of the invention will now be described with reference to FIGS. 1–4. A single, epitaxially grown wafer is etched or ion-implanted to electrically isolate components, those components including the detector 42, emitter 44 and modulator 46 shown in FIG. 3. Electromagnetic radiation in the form of an input beam 12 is incident on the input port of detector 42. Information carried by the electromagnetic radiation is converted to electrical signals by detector 42, and this information is transmitted to the electrical leads 46*a* of modulator 46 via detector output lead 42*a* and control circuit 48. The information so transmitted to modulator 46 serves as a modulating signal input for modulator 46.

Electromagnetic radiation from emitter 44 is transmitted, via waveguide 52 (or through space), so as to be incident on modulator 46. The modulator 46 employs the modulating signal input from detector 42 to encode the information from the incident radiation (input beam 44*a*) from emitter 44, resulting in a transmitted radiation output beam 18.

It should be noted that the exact geometry and arrangement of the isolated elements or integrated devices of the present invention depend on the required functionality of the single chip on which those elements are disposed One can envision changes to the arrangement shown in FIG. 3; for example, individual elements can be cascaded in order to increase the functionality of the chip. Furthermore, emitter 44 can operate either in a laser mode or in an LED (light-emitting diode) mode.

Figure 5A:
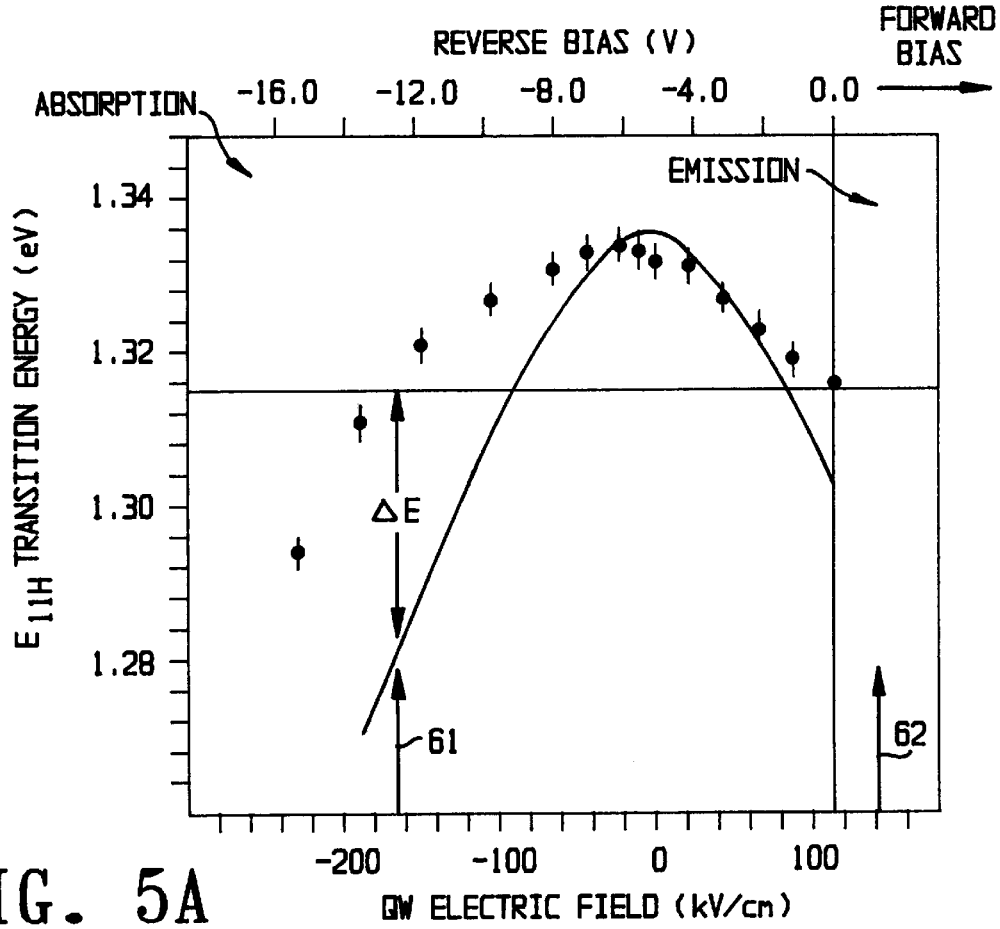
FIG. 5A is a plot of transition energy versus reverse bias and transition energy versus electric field in a quantum well.

FIG. 5A is a plot of transition energy versus reverse bias (upper portion of the figure) and transition energy versus electric field in the quantum well (lower portion of the figure). Actual data points are plotted, appearing as dots in FIG. 5A. The device of the present invention will emit radiation from levels associated with the quantum well when a forward bias is applied to the device, that is, in the rightmost portion of the graph of FIG. 5A (to the right of the vertical line indicating 0.0 volts). Conversely, the device of the present invention will absorb energy when the device is subjected to a reverse bias, as indicated by the left portion of the graph of FIG. 5A, that is, that portion of the graph to the left of the vertical line indicating 0.0 volts.

In FIG. 5A, arrow 61 indicates the bias required for the modulator and detector to function at a quiescent point. Arrow 62 indicates the bias required for emission by the device, operating in either the laser mode or the LED mode.

It should be noted that, in accordance with the present invention, the only two requirements for operation of the device are: (1) the quantum well material must be under compression relative to the barrier material (tension is permitted if n- and p- doping is reversed); and (2) the materials must be non-centrosymmetric. Thus, many III-V material systems can be used for the integration of the components of the device, that is, the detector 42, emitter 44 and modulator 46 of FIG. 3.

Figure 5B:
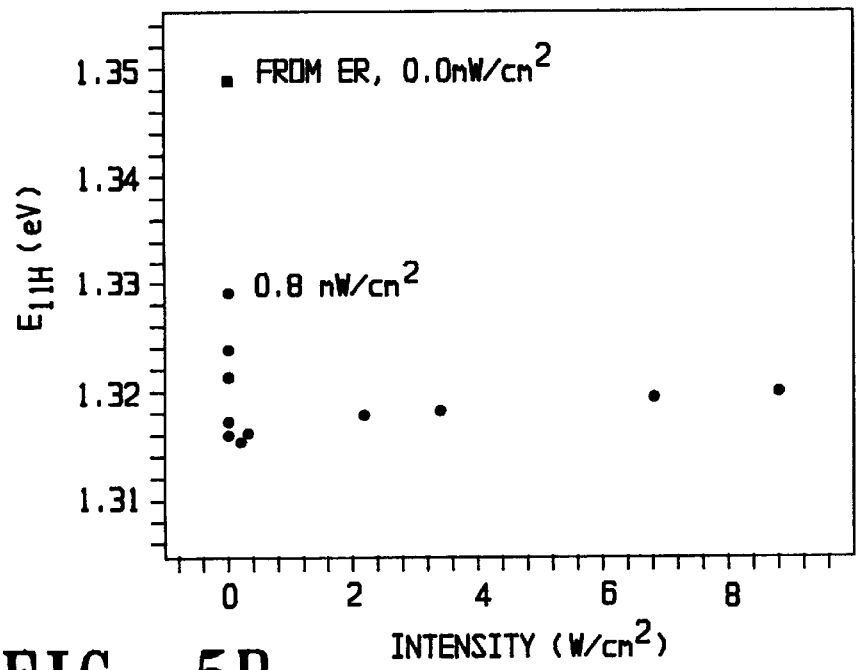
FIG. 5B is a plot of transition energy versus intensity of incident light for a device of the present invention.

Since the strained-layer quantum well can have a large strain-induced field, large changes in the quantum well energies can be effected with small changes in the total electric field in the quantum well. The total field in the quantum well has two components: (1) the piezoelectric component; and (2) the P-I-N built-in electric field component. Thus, incident light in a (111)B structure with an embedded quantum well will reduce the P-I-N field, and thereby increase the quantum well field (those two fields being in opposite directions). The quantum well optical transition will then shift, as indicated in FIG. 5B, which is a plot of transition energy versus intensity and demonstrates peak energy of the device. In fact, the transition energy shifts by about 35 meV. This effect can be used in an optically controlled waveguide modulator.

While preferred forms and arrangements have been shown in illustrating the invention, it is to be understood that various changes and modifications can be made without departing from the spirit and scope of this disclosure.

We claim:

1. An optoelectronic device, comprising:

detection means for receiving electromagnetic radiation and for converting said electromagnetic radiation to a modulating signal, emitter means for transmitting further electromagnetic radiation, and modulating means for receiving said modulating signal and said further electromagnetic radiation, and for encoding said further electromagnetic radiation onto said modulating signal to produce an output of said device;

wherein at least two of said detector means, said emitter means and said modulating means are incorporated into a single semiconductor chip.

2. The device of claim 1, wherein said at least two of said detector means, said emitter means and said modulating means are incorporated into said single semiconductor chip by a method other than a regrowth technique and a packaging of multiple optical elements together.

3. The device of claim 1, wherein said at least two of said detector means, said emitter means and said modulating means are incorporated into a single semiconductor chip by use of a piezoelectric semiconductor.

4. The device of claim 1, wherein said at least two of said detector means, said emitter means and said modulating means are incorporated into a single semiconductor chip by use of an epitaxial growth technique.

5. The device of claim 1, wherein said at least two of said detector means, said emitter means and said modulator means are incorporated into a single semiconductor chip by growing a strained-layer quantum well diode structure to produce a piezoelectric field in a quantum well.

6. The device of claim 1, wherein said at least two of said detector means, said emitter means and said modulator means are electrically isolated and optically connected.

7. The device of claim 1, wherein each of said detector means, said emitter means and said modulating means are incorporated into a single semiconductor chip.

8. The device of claim 7, wherein said at least two of said detector means, said emitter means and said modulator means are electrically isolated and optically connected.

9. The device of claim 1, further comprising electrical contact means for applying a bias voltage to said device.

10. The device of claim 9, wherein said bias voltage applied to said device comprises at least one of a positive bias and a negative bias.

11. The device of claim 1, further comprising waveguide means for optically connecting at least two of said detector means, said emitter means and said modulating means.

12. The device of claim 1, wherein said single semiconductor chip comprises a GaAs substrate.

13. The device of claim 12, wherein said single semiconductor chip further comprises an intrinsic region formed from AlGaAs.

14. The device of claim 13, wherein said single semiconductor chip further comprises a buffer formed of GaAs disposed between said substrate and said intrinsic region.

* * * * *